United States Patent [19]
Lee et al.

[11] Patent Number: 5,923,056
[45] Date of Patent: Jul. 13, 1999

[54] ELECTRONIC COMPONENTS WITH DOPED METAL OXIDE DIELECTRIC MATERIALS AND A PROCESS FOR MAKING ELECTRONIC COMPONENTS WITH DOPED METAL OXIDE DIELECTRIC MATERIALS

[75] Inventors: Woo-Hyeong Lee, New Providence; Lalita Manchanda, Aberdeen, both of N.J.

[73] Assignee: Lucent Technologies Inc., Murray Hill, N.J.

[21] Appl. No.: 09/041,434

[22] Filed: Mar. 12, 1998

Related U.S. Application Data

[63] Continuation-in-part of application No. 08/871,024, Jun. 6, 1997.
[60] Provisional application No. 60/027,612, Oct. 10, 1996.

[51] Int. Cl.$^6$ .......................... H01L 27/00; H01L 29/227
[52] U.S. Cl. .......................... 257/192; 257/410; 257/411
[58] Field of Search .......................... 438/3, 240, 253, 438/261, 787, 791, 909; 257/192, 295, 298, 300, 316, 410, 411; 364/468.28, 490

[56] References Cited

U.S. PATENT DOCUMENTS

| | | | |
|---|---|---|---|
| 4,868,619 | 9/1989 | Mukherjee et al. | 257/300 |
| 5,238,855 | 8/1993 | Gill | 437/43 |
| 5,305,254 | 4/1994 | Murakama et al. | 365/122 |
| 5,341,010 | 8/1994 | Shimoji | 257/324 |
| 5,377,045 | 12/1994 | Wolfe et al. | 359/585 |
| 5,422,292 | 6/1995 | Hong et al. | 438/261 |
| 5,439,840 | 8/1995 | Jones, Jr. et al. | 438/3 |
| 5,520,992 | 5/1996 | Douglas et al. | 428/209 |
| 5,569,624 | 10/1996 | Weiner | 437/200 |
| 5,583,068 | 12/1996 | Jones, Jr. et al. | 438/3 |
| 5,656,837 | 8/1997 | Lancaster et al. | 257/314 |
| 5,656,840 | 8/1997 | Yang | 257/316 |
| 5,686,329 | 11/1997 | Chang et al. | 438/253 |
| 5,696,394 | 12/1997 | Jones, Jr. et al. | 257/310 |
| 5,731,238 | 3/1998 | Cavins et al. | 438/261 |

FOREIGN PATENT DOCUMENTS

| | | | |
|---|---|---|---|
| 63-102270 | 10/1986 | Japan | H01L 29/80 |
| 5-206412 | 10/1992 | Japan | H01L 27/115 |
| 7-30074 | 6/1993 | Japan | H01L 27/10 |

OTHER PUBLICATIONS

"Conduction Properties of Thin $Al_2O_3$ Films", by Arya, S. P. S. et al., *Thin Solid Filsm*, 91, pp. 363–374 (1982).

"Thermally Stable Thin Film Tantalum Pentoxide Capacitor", by Peters, M. et al., *ICEMCM 96 Proceedings*, pp. 94–99.

"Polyoxide Thinning LImitation and Superior ONO Interpoly Dielectric for Nonvolatile Memory Devices", by Mori, S. et al., *IEEE Transactions on Electron Devices*, vol. 38, No. 2, pp. 270–277 (Feb. 1991).

"ONO Inter–Poly Dielectric Scaling for Nonvolatile Memory Applications", by Mori, S. et al., *IEEE Transactions on Electron Devices*, vol. 38, No. 2, pp. 386–391 (Feb. 1991).

"Bottom–Oxide Scaling for Thin Nitride/Oxide Interpoly Dielectric in Stacked–Gate Nonvolatile Memory Cells", by Mori, S. et al., *IEEE Transactions on Electron Devices*, vol. 39, No. 2, pp. 283–291 (Feb. 1991).

"High Density Contractless, Self Aligned Eprom Cell Array Technology", by Esquivel, J. et al., *IEDM 86*, pp. 592–595 (1986).

*Primary Examiner*—John Barlow
*Assistant Examiner*—Bryan Bui
*Attorney, Agent, or Firm*—Richard J. Botos

[57] ABSTRACT

A doped, metal oxide dielectric material and electronic components made with this material are disclosed. The metal oxide is a Group III or Group VB metal oxide (e.g. $Al_2O_3$, $Y_2O_3$, $Ta_2O_5$ or $V_2O_5$) and the metal dopant is a Group IV material (Zr, Si, Ti, and Hf). The metal oxide contains about 0.1 weight percent to about 30 weight percent of the dopant. The doped, metal oxide dielectric of the present invention is used in a number of different electronic components and devices. For example, the doped, metal oxide dielectric is used as the gate dielectric for MOS devices. The doped, metal oxide dielectric is also used as the inter-poly dielectric material for flash memory devices.

10 Claims, 1 Drawing Sheet

ELECTRONIC COMPONENTS WITH DOPED METAL OXIDE DIELECTRIC MATERIALS AND A PROCESS FOR MAKING ELECTRONIC COMPONENTS WITH DOPED METAL OXIDE DIELECTRIC MATERIALS

STATEMENT OF RELATED APPLICATION

This application is a continuation-in-part application of U.S. Ser. No. 08/871,024, filed Jun. 6, 1997, which in turn claimed the benefit of U.S. Provisional Application No. 60/027,612, filed Oct. 10, 1996. U.S. Ser. No. 08/871,024 is incorporated by reference herein.

BACKGROUND OF THE INVENTION

1. Technical Field

The invention relates to semiconductor devices and components and, specifically, to metal oxide dielectric materials for use in semiconductor devices and components.

2. Art Background

Dielectric materials are a key aspect to the performance of semiconductor devices. As devices become smaller, and the need for higher performance becomes greater, the thickness of the dielectric layers in semiconductor devices is decreasing. At the same time, the need for dielectric materials with a dielectric constant greater than that of the most common dielectric material, $SiO_2$, is increasing. Also, as the thickness of the dielectric layer in semiconductor devices decreases, the need for materials that do not leak charge even when the layer of the dielectric material is very thin (e.g. less than 100 Å) is increasing.

However, not all dielectric materials form acceptable, thin dielectric layers for use in semiconductor devices and components. Semiconductor devices have certain performance requirements such as efficiency, power of operation, etc. The properties of the layer of dielectric material directly effect device performance. For example, if the thin dielectric layer allows too much current to pass through it (this unwanted current is referred to as leakage current), then the resulting device or component will not meet the desired performance requirement. Since the leakage current through the gate dielectric of a MOSFET (metal-oxide-semiconductor-field-effect-transistor) indicates the insulation properties (resistance and reliability) of the dielectric, a gate dielectric layer through which the leakage current is too high indicates that the resistance and reliability of the dielectric layer is too low. In the semiconductor device context in which the layer of dielectric material is an interpoly (i.e. the dielectric material is sandwiched between two layers of polycrystalline silicon) dielectric material (IPD), the leakage current in the IPD is related to the retention time of the flash memory. If the leakage current through the IPD is too high, then the retention time of device will be too low.

The interface state density between the dielectric layer and the underlying semiconductor interface also affects device performance. The interface state density degrades the current drive (current across the channel) and the reliability of MOSFETs and MIS(metal-insulator-semiconductor) FETs. Thus, if the interface state density is too high, then the resulting device or component will not meet the desired performance requirement.

Consequently dielectric materials that form thin dielectric layers with acceptable leakage characteristics and other properties are sought.

SUMMARY OF THE INVENTION

The present invention is directed to electronic components such as integrated circuit devices and integrated or discrete components such as linear capacitors having a layer of dielectric material. The dielectric material is a metal oxide of a Group III metal or Group VB metal that is doped with a Group IV element. Examples of a Group III (group, as used herein, means the groups of the Mendeleef Periodic Table) metal oxide include aluminum oxide ($Al_2O_3$) and yttrium oxide ($Y_2O_3$). Examples of Group VB metal oxides are tantalum pentoxide ($Ta_2O_5$) and vanadium pentoxide ($V_2O_5$). Examples of suitable Group IV dopants include zirconium (Zr), silicon (Si), titanium (Ti) and hafnium (Hf). The dopant is about 0.1 weight percent to about 30 weight percent of the metal oxide. It is advantageous if the dopant is about 0.1 weight percent to about 10 weight percent of the metal oxide.

A layer of dielectric material is formed on the surface of a substrate suited for the desired device or component using a conventional deposition technique such as sputtering, chemical vapor deposition (CVD), metal organic CVD (MOCVD) and atomic layer deposition (ALD). The dopant is added to the metal oxide during the formation of the layer on the substrate. Once the doped metal oxide of the desired thickness is formed on the substrate, conventional processing techniques are then used to complete the device.

In one embodiment of the present invention, the semiconductor device is a MOS or MIS device. The structure of such devices is well known to one skilled in the art and will not be discussed in detail herein. The gate dielectric layer in these devices is the previously described doped metal oxide. Because of the low leakage, low interface state density, and high dielectric constant of these materials, the gate dielectric layer in these devices is as thin as the minimum acceptable thickness as limited by the onset of direct tunneling leakage current (e.g. about 30 Å or thinner). Although there are many tunneling currents, as used herein, tunneling currents refer to direct tunneling currents. Thus the gate dielectric layer in the devices of the present invention has advantages over conventional dielectric materials such as $SiO_2$ (where the minimum thickness is limited by the onset of tunneling leakage current) or undoped metal oxides such as, for example, $Al_2O_3$ (where the minimum thickness is limited both by high interface state density and the onset of tunneling leakage current).

The MOS devices of the present invention are fabricated using conventional techniques well known to one skilled in the art. Conventional processing steps both before and after the deposition of the gate dielectric layer are contemplated as suitable.

In a second embodiment of the present invention, the device is a nonvolatile memory device. Nonvolatile memory is a type of memory that retains stored data when power is removed. Examples of nonvolatile memories include erasable programmable read only memories (EPROMs) and electrically erasable programmable read only memories (EEPROMs). For convenience, flash, EEPROMs and EPROMs are referred to collectively herein as EPROMs.

Nonvolatile memory devices of the present invention have a conventional structure, but the IPD layer of the device is the dielectric material of the present invention. The IPD layer is deposited using the previously described depositions techniques. The nonvolatile memory devices of the present invention are formed using conventional processing techniques for forming such devices both before and after the IPD layer is formed.

Other devices in which the dielectric material of the present invention is contemplated as useful are in storage capacitors for dynamic random access memories (DRAMs).

The dielectric material of the present invention is also useful as the dielectric layer in linear capacitors and other integrated capacitors and capacitive devices.

DETAILED DESCRIPTION

Figure 1:
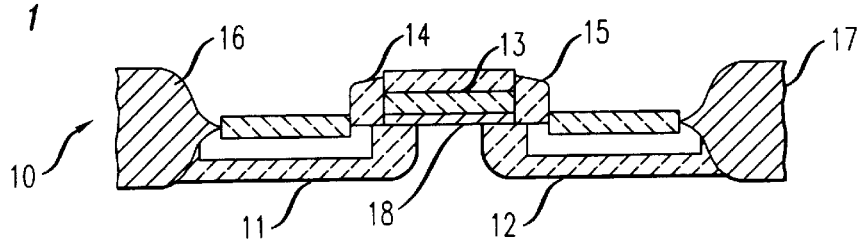
FIG. 1 is a schematic side view of a MOSFET device of the present invention

The present invention is directed to doped metal oxide material. These doped metal oxides are used to form layers of dielectric material in a variety of electronic components such as MOS devices, flash EPROM devices, capacitors for DRAMs, linear capacitors, and other integrated capacitors. The doped metal oxide dielectric materials of the present invention are metal oxides of a Group III metal or Group VB metal that is doped with a Group IV element. It is advantageous, for a given combination of metal and dopant, if the energy of oxide formation for the dopant is less than the energy of oxide formation for the metal oxide which is doped. Examples of a Group III (group, as used herein, means the groups of the Mendeleef Periodic Table) metal oxide include aluminum oxide ($Al_2O_3$) and yttrium oxide ($Y_2O_3$). Examples of a Group VB metal oxide are tantalum pentoxide ($Ta_2O_5$) and vanadium pentoxide ($V_2O_5$). Examples of suitable Group IV dopants include zirconium (Zr), silicon (Si), titanium (Ti) and hafnium (Hf). The doped metal oxide is about 0.1 weight percent to about 30 weight percent dopant. It is advantageous if the doped metal oxide is about 0.1 weight percent to about 10 weight percent dopant.

Although the applicants do not wish to be held to a particular theory, the applicants believe that the presence of the dopants stabilize the defects in the bulk of the metal oxide and defects that form at the interface between the metal oxide and adjacent semiconductor or metal layers. Such defects include dangling or strained bonds or grain boundaries. Dangling bonds are what the name implies, an atom that has an incomplete bond. Dangling bonds (also referred to as trap states) are therefore undesirable. Strained bonds are bonds that are under some strain from physical characteristics of the interface. These strained bonds are more easily broken, and dangling bonds result. Thus, strained bonds are also undesirable.

It is advantageous to reduce the number of dangling bonds, strain bonds and stabilize the grain boundaries in the bulk material and at the interface between the dielectric material and the adjacent layer because such reduction improves the electrical characteristics of the dielectric material. It is applicants belief that the addition of the prescribed dopants to the dielectric materials described herein actually reduces the number of these undesired defects. The amount of dopant introduced into the metal oxide will depend upon the desired electrical properties of the dielectric material. Applicants believe that the doped dielectric materials of the present invention are advantageous because the energy of oxide formation for the dopant is less than the enthalpy of oxide formation for the metal that, after oxidation, is doped.

For example, the enthalpy of formation for aluminum oxide is −390 kcal/mol. The enthalpy of formation for zirconium oxide is −266 kcal/mole. The enthalpy of formation for the silicon oxide is −217 kcal/mole. A layer of aluminum oxide material will contain a certain number of dangling bonds, strain bonds and grain boundaries in the bulk material and at the interface between the dielectric material and the adjacent layers. If that same layer of aluminum oxide is doped with zirconium or other Group IV metal, the number of dangling bonds, strain bonds and grain boundaries in the bulk material and at the interface between the dielectric material and the adjacent layers is reduced. Applicants believe that this is the result of the reaction kinetics that favor the formation of the dopant oxide (e.g. the formation of zirconium oxide) over the formation of the metal oxide (e.g. the formation of aluminum oxide). Dangling bonds, strain bonds and grain boundaries in the bulk material and at the interface between the dielectric material do not form to the same degree because of the ability of the dopant (e.g. zirconium) to react with the oxygen at the site of these would-be defects, thereby removing at least a portion of them. As a result, the properties of the dielectric material are improved over undoped dielectric material.

As previously noted, the dielectric material of the present invention is used in a variety of electronic devices and electronic components.

In one embodiment of the present invention, the doped dielectric material is the gate dielectric material in a MOSFET device. Such a device is pictured schematically in FIG. 1. The MOSFET 10 has a source 11, a drain 12 and a gate 13. The gate 13 is positioned between sidewall spacers 14 and 15. The source 11 and drain 12 extend from contact with the respective sidewall spacers 14 and 15 to respective field oxide regions 16 and 17. The gate dielectric layer 18 is the doped metal oxide material of the present invention.

Figure 2:
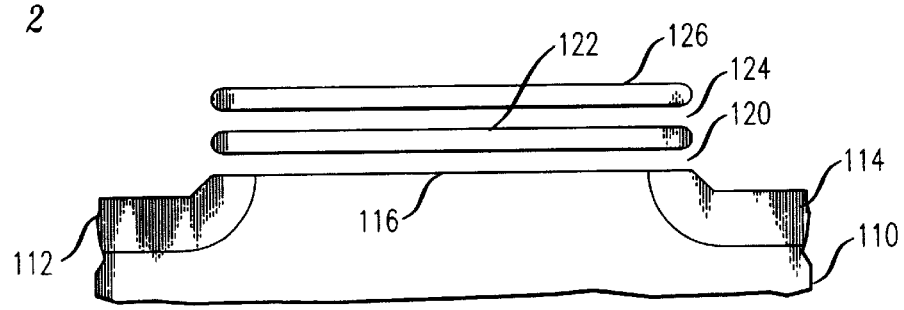
FIG. 2 is a schematic side view of a flash EPROM device of the present invention.

In a second embodiment of the present invention, the doped dielectric material is the IPD of a flash EPROM device. Such a device is illustrated in FIG. 2. The device has a layer of silicon dioxide ($SiO_2$) 120 formed over a substrate 110 with source 112, drain 114 and channel regions 116 formed therein. The oxide is formed by conventional techniques such as furnace oxidation in conventional atmospheres such as $O_2$ and $N_2O$ and rapid thermal oxidation (RTO) which are well known to one skilled in the art.

A polysilicon floating gate 122 is formed over the gate oxide layer 120. The polysilicon layer 122 is formed using conventional techniques such as chemical vapor deposition (CVD). The thickness of the polysilicon layer 122 is largely a matter of design choice. Typically the thickness of the floating gate is about 50 nm to about 100 nm.

The IPD 124 is formed over the floating gate using conventional techniques. Typically, a technique such as sputtering, chemical vapor deposition, or oxidation is used to form the IPD layer. As previously noted, it is advantageous if the IPD layer has a dielectric constant of at least about 8 but does not permit significant leakage of current from the floating gate. In this embodiment, the dopant concentration must not cause the material to have unacceptably high leakage and unacceptably low breakdown strength.

For the device to retain its charge for at least about ten years the leakage of charge through the IPD layer should be less than or equal to about $10^{-14}$ A/cm$^2$. In this embodiment, low leakage materials are desired so that the charge remains on the floating gate. The above-identified dielectric materials are examples of materials that meet this requirement.

The control gate 26 is a layer of conductive material formed over the IPD layer 24. The control gate is a conventional material such as doped polysilicon, metal silicide, titanium nitride, or a dual layer of polysilicon and metal silicide. The control gate layer is formed and patterned using conventional techniques for fabricating MOS devices.

In this embodiment, the device of the present invention, the material and the thickness of the IPD layer are selected to provide a device that operates at low voltage and yet retains the charge on the floating gate for an adequately long time. In the devices of the present invention, the material and thickness of the IPD layer and the thickness of the tunnel oxide (TO) layer are selected such that $K_{IPD}E_{IPD} \approx K_{TO}E_{TO}$. In this equation, the dielectric constant of the material is denoted K and the electric field of the layer is denoted E. In the context of the present invention, it is advantageous if $E_{TO}$ is large to provide an environment in which the device is erased quickly. In this regard, it is advantageous if $E_{TO}$ is at least about 8 MV(megavolts)/cm. It is also advantageous if $E_{IPD}$ is small because the smaller $E_{IPD}$ is, the more reliable is the IPD. In this regard, it is advantageous if $E_{IPD}$ is less than about 5 MV/cm. Since $K_{TO}$ is fixed, an increase in $K_{IPD}$ will result in an increase in $E_{TO}$ for a given bias on the control gate and for given thicknesses of the tunnel oxide and the IPD.

In a third embodiment of the present invention, the dielectric material is used in a storage capacitor of a DRAM device. In a fourth embodiment of the present invention, the dielectric material is used in a linear capacitor. The use of the dielectric material of the present invention in other integrated and discrete capacitor applications is also contemplated.

In the above described embodiments, the dielectric material has been described as a single layer that contains one dopant. However, it is contemplated that the dielectric layer will contain one or more discrete layers of material. In the multi-layer embodiments, at least one of the layers is doped as previously described. One skilled in the art will appreciate that a multi-layer structure is useful when one layer is used to provide the desired dielectric layer and one layer is used to improve the interface between the dielectric layer and the adjacent layer. Likewise, it is also contemplated that the doped layers will contain one or more than one dopant. For example, a first dopant could be incorporated into the metal oxide to improve the dielectric properties of the metal oxide and a second dopant could be added to improve the interface between the dielectric material and the material adjacent to the dielectric layer.

EXAMPLE 1

Several films of doped and undoped aluminum oxide were formed. The dopants used were zirconium and silicon. The films were formed on six-inch silicon wafers. Before the metal oxide films were formed on the substrates, the substrates were cleaned using an aqueous solution of hydrofluoric acid (15:1 HF). After cleaning, the silicon substrate was placed in a loadlock vacuum chamber to prevent further native oxide growth.

Doped and undoped aluminum oxide films were formed on the substrate using reactive sputtering in an Argon/Oxygen atmosphere. An aluminum target with one percent by weight silicon distributed uniformly in the target was used to form the silicon-doped films. An aluminum target with 0.5 weight percent zirconium distributed uniformly in the target was used to form the zirconium-doped films. A high purity (99.9 weight percent) aluminum target was used to form the undoped aluminum oxide films.

The films were formed by placing the desired target in the sputter chamber. Argon and oxygen were then introduced into the chamber. The plasma glow was obtained by applying an alternating current (AC) power between the cathode and the anode in the range of about 1 kW to about 2 kW (the specific current used will depend upon the system being used). Target burn-in was performed prior to deposition to oxidize the surface of the target. The current and voltage were monitored to ascertain when burn-in was complete.

The substrate temperature was maintained at 380° C. during the sputter deposition of the metal oxide film thereon. The deposition rate was 1.1 Å/second. The thickness of the resulting films varied less than two percent across the surface of the wafers. The oxygen and argon flow rates were controlled during film deposition using a mass flow controller.

The thickness of each film was about 10 nm. One of each type of film was subsequently annealed at 550° C. for thirty minutes in a nitrogen atmosphere. A second of each type of film was subsequently annealed at 550° C. for thirty minutes in an oxygen atmosphere.

The leakage current that passed through the various films was measured using the standard current-voltage (I-V) test well known to one skilled in the art. The applied voltage was 1.5 MV(mega volt)/cm. The surface area of the films were 1000 $\mu m^2$. The results for the films annealed at 550° C. are reported in FIG. 2. FIG. 2 shows that the leakage current through the undoped film was over an order of magnitude greater than the leakage current in the aluminum oxide films doped with silicon or zirconium. The leakage characteristics of the films annealed in an oxygen atmosphere were virtually identical to the leakage characteristics of the films annealed in a nitrogen atmosphere. Films that were annealed at 800° C. and unannealed films exhibited similar trends.

Figure 3:
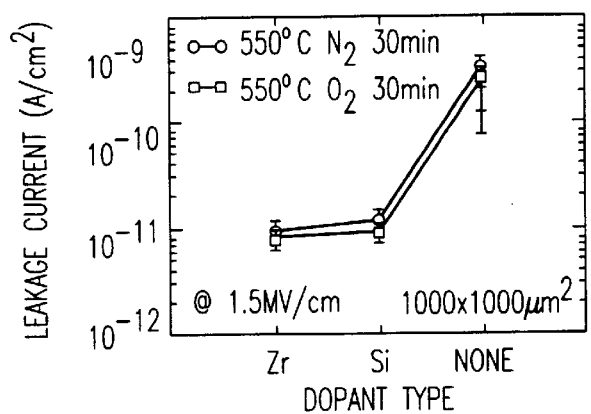
FIG. 3 compares the leakage characteristics of the doped metal oxide dielectric materials of the present invention with the leakage characteristics of undoped metal oxide layers.
Figure 4:
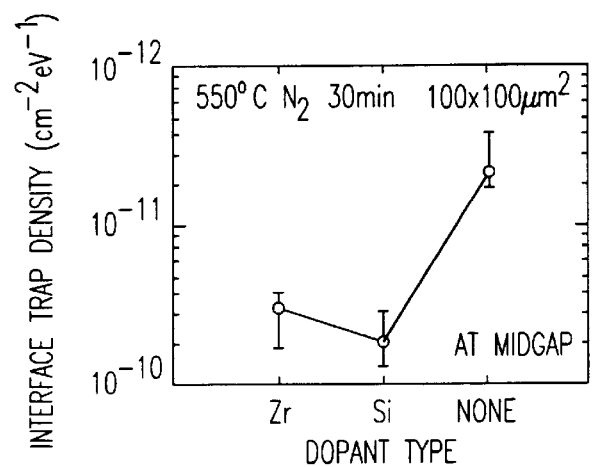
FIG. 4 compares the interface trap density of the doped metal oxide dielectric materials of the present invention with the interface trap density of undoped metal oxide layers.

The interface trap density of the various films was measured using the standard capacitance-voltage (C-V) quasistatic method well known to one skilled in the art. The surface area of the films were 100 $\mu m^2$. The results are reported in FIG. 3. FIG. 3 shows that the interface state density of the undoped film was over an order of magnitude greater than the interface state density in the aluminum oxide films doped with either silicon or zirconium.

What is claimed is:

1. An electronic component comprising a dielectric material, wherein the dielectric material is a metal oxide of a group III metal or group VB metal that is doped with at least one group IV element, wherein the Groups are from groups of the Mendeleef Periodic Table, and wherein the dielectric material is about 0.1 weight percent to about 30 weight percent dopant.

2. The electronic component of claim 1 wherein the metal oxide is selected from the group consisting of aluminum oxide, yttrium oxide, tantalum pentoxide, and vanadium oxide, the dopant is selected from the group consisting of zirconium, silicon, titanium, and hafnium.

3. The electronic component of claim 1 wherein the amount of dopant is about 0.1 weight percent to about 10 weight percent of the dielectric material.

4. The electronic component for claim 1 wherein the component is an MOS device and the dielectric material is the gate dielectric of the MOS device.

5. The electronic component of claim 1 wherein the component is an MIS device and the dielectric material is the gate dielectric of the MIS device.

6. The electronic component for claim 1 wherein the component is a nonvolatile memory device and the dielectric material is the interpoly dielectric layer of the nonvolatile memory device.

7. The electronic component of claim 1 wherein the component is a capacitor for a dynamic random access memory device.

8. The electronic component of claim 1 wherein the component is a linear capacitor and the dielectric material is the capacitor dielectric material.

9. The electronic component of claim 1 wherein the Group III metal or Group VB metal has a first energy of oxide formation and the Group IV element has a second energy of oxide formation and wherein the formation is greater than the second energy of oxide formation.

10. The electronic component of claim 1 wherein the dielectric material is a multilayer structure in which at least one of the layers is the doped, metal oxide layer.

* * * * *